(12) United States Patent
Laforce (10) Patent No.: US 9,064,981 B2
(45) Date of Patent: Jun. 23, 2015

(54) DIFFERENTIAL OPTICAL RECEIVER FOR AVALANCHE PHOTODIODE AND SIPM

(71) Applicant: Excelitas Canada Inc., Vaudreuil-Dorion (CA)

(72) Inventor: Frederic Laforce, Coteau-du-Lac (CA)

(73) Assignee: Excelitas Canada, Inc., Vaudreuil-Dorion (CA)

( * ) Notice: Subject to any disclaimer, the term of this patent is extended or adjusted under 35 U.S.C. 154(b) by 184 days.

(21) Appl. No.: 13/850,496

(22) Filed: Mar. 26, 2013

(65) Prior Publication Data

US 2014/0291487 A1  Oct. 2, 2014

(51) Int. Cl.
*H01L 31/02* (2006.01)

(52) U.S. Cl.
CPC ......... *H01L 31/02016* (2013.01); *H01L 31/02* (2013.01)

(58) Field of Classification Search
CPC ......... G01J 1/44; G01J 2001/444; G01J 1/46; H03G 3/3084; H01L 27/14643; H01L 31/02; H01L 27/14609; H01L 31/08–31/095; H04B 10/66; H04B 10/60; H01J 40/14; H03F 3/08; H03F 3/087; H03F 3/082
USPC .... 250/214 A, 214 C, 214 R, 214.1, 214 LA; 330/308; 398/202; 327/514
See application file for complete search history.

(56) References Cited

U.S. PATENT DOCUMENTS

| 5,168,154 | A | | 12/1992 | Harley |
| 5,329,115 | A | * | 7/1994 | Lim ........................ 250/214 R |
| 5,696,657 | A | | 12/1997 | Nourrcier et al. |
| 6,084,478 | A | | 7/2000 | Mayampurath |
| 6,784,750 | B2 | | 8/2004 | Chiou et al. |
| 6,803,825 | B2 | | 10/2004 | Chiou et al. |
| 7,259,363 | B2 | * | 8/2007 | Deppe et al. ............... 250/214 R |
| 7,309,853 | B2 | * | 12/2007 | Uchida et al. ............. 250/214 R |
| 7,402,788 | B2 | * | 7/2008 | McVey ....................... 250/214 R |
| 7,561,812 | B2 | | 7/2009 | Tai et al. |
| 8,035,317 | B2 | * | 10/2011 | Lee et al. ........................ 315/302 |
| 2002/0191263 | A1 | * | 12/2002 | Hoang et al. .................. 359/189 |
| 2004/0130397 | A1 | | 7/2004 | Mactaggart |
| 2009/0238582 | A1 | * | 9/2009 | Tsunoda et al. .............. 398/208 |

FOREIGN PATENT DOCUMENTS

EP   0643496 A1   3/1995

OTHER PUBLICATIONS

Corsi, F., Dragone, A., Marzocca, C., Guerra, A., Delizia, P., Dinu, N., ... Betta, G. (2006). Modelling a silicon photomultiplier (SiPM) as a signal source for optimum front-end design. Nuclear Instruments and Methods in Physics Research Section A: Accelerators, Spectrometers, Detectors and Associated Equipment, (572), 416-418.*
English Translation of EP0643496A1 provided by Espacenet at the European Patent Office on Feb. 25, 2015.

* cited by examiner

*Primary Examiner* — Georgia Y Epps
*Assistant Examiner* — Carolynn A Moore
(74) *Attorney, Agent, or Firm* — Peter A. Nieves; Sheehan Phinney Bass + Green PA (57) ABSTRACT

A device and method to protect an APD or SiPM optical receiver against photodetector voltage supply variation is presented. A differential trans-impedance amplifier includes one input connected to the photodetector and the other input connected to a high voltage supply variation sensing device. The sensing element includes a circuit replicating the impedance of the photodetector.

26 Claims, 5 Drawing Sheets

FIG. 9 ial optical receiver for avalanche photodiode and SiPM.
Briefly described, the present invention is directed to a photoelectric receiver circuit for converting an optical signal to an electrical signal. The circuit includes a differential transimpedance amplifier, a photodiode connected to one input of the differential transimpedance amplifier, a high voltage supply source configured to provide a bias voltage to the photodiode, an impedance element connected between the high voltage supply source and the photodiode, and a high voltage supply variation sensing element with one terminal connected to the high voltage supply and the second terminal connected to the second input of the differential transimpedance amplifier. The impedance element is configured so the voltage of the high voltage supply source varies in response to light impinging the photodetector.

A second aspect of the present invention is directed to a photoelectric receiver circuit for converting an optical signal to an electrical signal. The circuit includes a transimpedance amplifier, a photodiode connected to an input of the transimpedance amplifier, a high voltage supply source configured to supply a bias voltage to the photodiode, and a voltage sensing element connected between the high voltage supply and a current mirror input. The current mirror output is connected to the photodiode and the input of the transimpedance amplifier to form a pseudo-differential transimpedance amplifier. An impedance element may or may not be connected between the high voltage supply source and the high voltage supply; the impedance element is configured so the voltage of the high voltage supply source varies in response to light impinging the photodetector.

Briefly described, in architecture, a third aspect of the present invention is directed to a photoelectric receiver circuit for converting an optical signal to an electrical signal. The circuit includes a differential transimpedance amplifier, a
DIFFERENTIAL OPTICAL RECEIVER FOR AVALANCHE PHOTODIODE AND SIPM

FIELD OF THE INVENTION

The present invention relates to light sensors, and more particularly, is related to a photodetector circuit.

BACKGROUND OF THE INVENTION

Photodetectors are used to detect light of a given wavelength and produce a current proportional to the intensity of the detected light. A photodetector may be supplied with a bias voltage. The output of the photodetector may vary with variations of the bias voltage.

Figure 1:
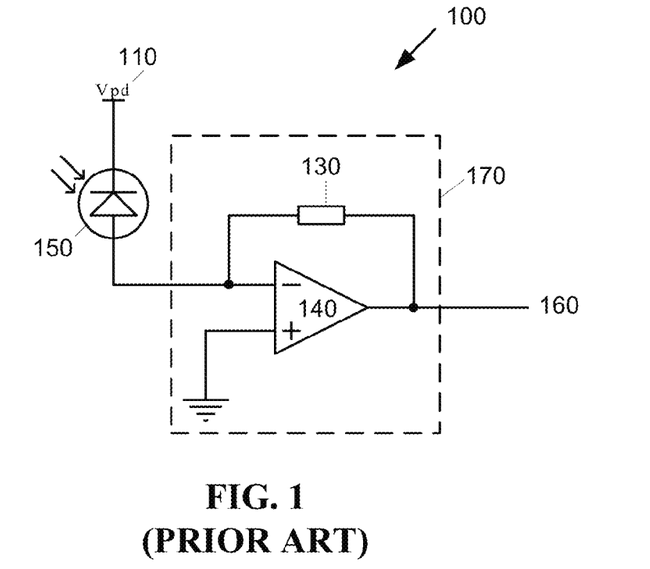
FIG. 1 is a circuit diagram of a first prior art photodetector circuit.

A prior art photodetector circuit 100 is shown in FIG. 1. The circuit includes a photodetector 150 between a high voltage supply 110 and a transimpedance amplifier 170 (TIA) including a voltage amplifier 140 and a feedback resistor 130. The signal (photocurrent) from the photodetector 150 is amplified by the transimpedance amplifier 170, thereby converting a photocurrent from the detector into a voltage 160 suitable for post processing, for example, by a post processing circuit (not shown).

Any variation of the high voltage supply 110 is coupled to the input of the transimpedance amplifier 170 through the impedance of the photodetector 150. Examples of such variations include noise from power supply or intentional high voltage supply variation for Gain control in the case of an avalanche photodiode (APD) or a silicon photomultiplier (SiPM). As such, any voltage variation from the high voltage supply 110 is converted into a current which is amplified by the transimpedance amplifier 170 and added to the signal coming from the photodetector 150. The voltage resulting from the variation of the high voltage supply 110 may impact the output signal 160 at the output of the transimpedance amplifier 170 in different ways. For example, the variation may be seen as noise impacting the detection capability of a post processing system (not shown) processing the optical signal. Similarly, the variation may create an offset at the output of the transimpedance amplifier 170. In addition, the variation may impact the frequency response of the receiver 100 when voltage from the high voltage supply 110 is correlated with photocurrent.

Figure 2:
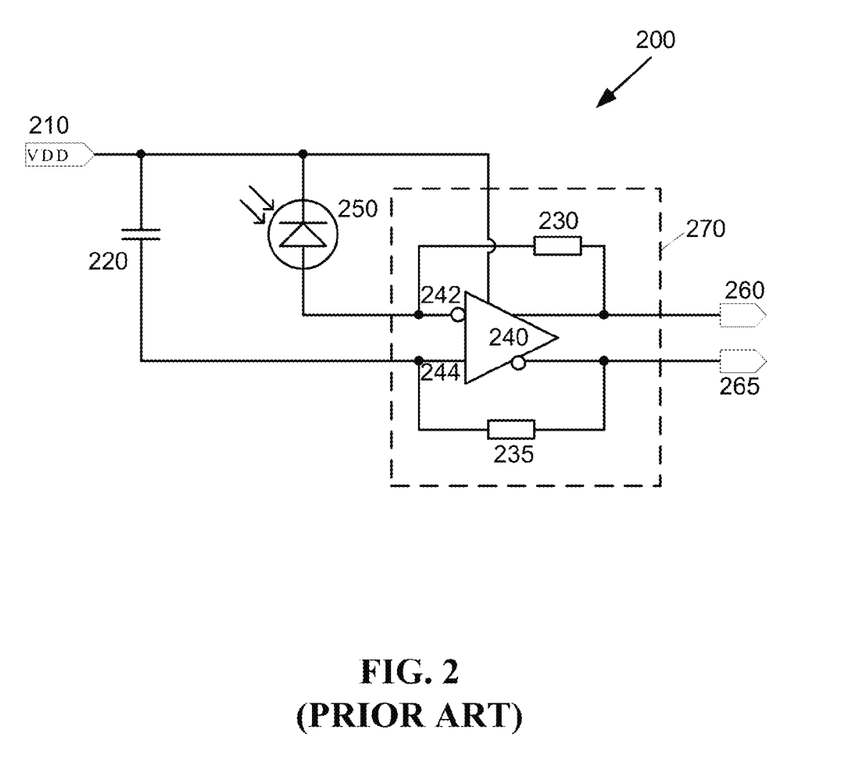
FIG. 2 is a circuit diagram of a second prior art photodetector circuit.

A second prior art circuit 200, as shown in FIG. 2 and described by US Patent application 2004/0130397 A1 and U.S. Pat. No. 7,561,812, B2, attempts to provide immunity to noise from a voltage source 210 with a differential transimpedance amplifier 270. The second prior art circuit 200 connects a photodiode 250 between the voltage source 210 and an inverted input to the differential transimpedance amplifier 270, while placing a capacitor 220 between the voltage source 210 and a non-inverted input to the differential transimpedance amplifier 270. Capacitor 220 has a value equal to the junction capacitance of the photodetector 250. Resistances 230 and 235 are respectively placed across the inverted and non-inverted sides of the amplifier 240. US Patent application 2004/0130397 A1 and U.S. Pat. No. 7,561,812, B2 both target low voltage applications and offer limited performance for high frequency applications using avalanche photodiodes (APD) and not sufficient for a silicon photomultiplier (SiPM).

For high frequency applications using Avalanche Photodiodes or SiPM, a simple capacitance may not accurately model the photodetector and high voltage required to bias the APD or SiPM, limiting the usefulness of this prior art.

Furthermore, both circuits are limited to common mode current (the current injected simultaneously at the inputs of the differential transimpedance amplifier) within the dynamic range of each input of the differential transimpedance amplifier. A large variation in the voltage source 210 can saturate the transimpedance amplifier 270.

Variations of a high voltage supply are addressed by U.S. Pat. No. 5,696,657, where the rate at which the high voltage supply is varied is carefully controlled in order to minimize the amount of current flowing through the APD. This is an important limitation of a system if it is desirable to change the APD gain quickly as it is the case in range finding application where a close target may reflect a significant amount of light back into the receiver thus saturating the receiver and blinding the receiver from detection of targets located in the line of sight at a greater range. Prior art also discloses various ways of managing high current by extending the dynamic range of the transimpedance amplifier.

The pseudo differential transimpedance amplifiers discussed in U.S. Pat. No. 6,803,825 B2 and U.S. Pat. No. 6,784,750 B2 sense the high voltage supply variation to give an indication of the photocurrent through the use of a coupling capacitor on the high voltage. This configuration uses the coupling capacitor as a way to measure the AC photocurrent regardless of the source of the AC current flowing through the photodetector. These circuits assume that the AC current comes only from the photocurrent as they cannot react to large voltage supply variation. Also, these circuits inject a DC current at the input of the transimpedance amplifier which cannot be used for fast signal variation. Therefore, there is a need in the industry to address the above shortcomings.

SUMMARY OF THE INVENTION

Embodiments of the present invention provide a different photodiode connected to a first input of the differential transimpedance amplifier, a high voltage supply source configured to supply a bias voltage to the photodiode, a first voltage sensing element connected between the high voltage supply and a second input of the differential transimpedance amplifier, a second voltage sensing element connected between the high voltage supply and an input of a first current mirror, and a second current mirror connected between the first current mirror and the second input of the differential amplifier. The first current mirror output is connected to the first input of the differential transimpedance amplifier. An impedance element may or may not be connected between the high voltage supply source and the high voltage supply; the impedance element is configured so the voltage of the high voltage supply source varies in response to light impinging the photodetector.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Reference will now be made in detail to embodiments of the present invention, examples of which are illustrated in the accompanying drawings. Wherever possible, the same reference numbers are used in the drawings and the description to refer to the same or like parts.

This invention provides a photodetector receiver circuit configured to eliminate current induced in the photodetector by a high voltage supply variation from reaching the output of the transimpedance amplifier.

Exemplary embodiments of an APD or SiPM optical receiver immune to photodetector voltage supply variation are presented. A differential transimpedance amplifier includes one input connected to the photodetector and the other input connected to a high voltage supply variation sensing device. The sensing element includes a circuit replicating the impedance of the photodetector.

An optical receiver circuit for converting an optical signal to an electrical signal uses a photodetector having its cathode connected to a high voltage supply and its anode connected to the input of a transimpedance amplifier. High voltage supply variation induces an AC current flowing through the avalanche photodiode equivalent impedance and is added to the photocurrent from the photodetector. The high voltage variation induced current is summed to the photocurrent and can create noise, create an offset to output voltage of the transimpedance amplifier, or impact the frequency response of the optical receiver if the voltage variation is correlated to the photocurrent.

The present invention provides a photoelectric receiver circuit converting an optical signal to an electrical signal. The receiver includes a differential transimpedance amplifier, a photodiode having a first end connected to one input of a differential transimpedance amplifier and the second end of the photodiode connected to a high voltage supply source suitable to bias the photodiode to the required voltage, a voltage sensing element with one terminal connected the high voltage supply and the second terminal connected to the second input of the differential transimpedance amplifier. Several embodiments provide ways to immune an optical receiver from high voltage supply variation.

The voltage sensing element presents substantially the same impedance as the primary photodetector. The current flowing through the high voltage sensing element and the current flowing through the photodetector in response to a variation of the high voltage supply is seen as a common mode current which is attenuated by the Common Mode Rejection Ratio (CMRR) of the differential transimpedance amplifier. The more similar the impedance of the sensing element is to the light sensing device, the better the common mode rejection ratio will be. For example, ideally the sensing element could be a dummy photodetector that does not receive a light signal of the same type as the primary photodetector. Alternatively, an equivalent circuit can be used to represent the photodetector at the cost of lower immunity to high voltage supply noise.

An APD equivalent impedance may be modeled by a resistor in series with a capacitance and an inductor which represent the series resistance of the APD, the junction capacitance of the APD at the nominal operating voltage, and an inductor representing the interconnection of the APD to the outside world. Other potential parasitic elements may also be included.

Figure 3:
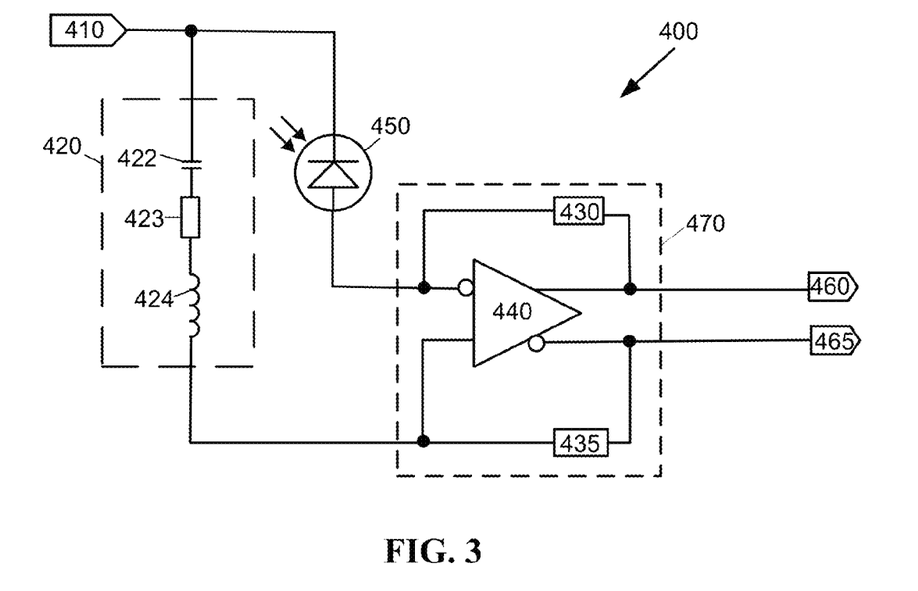
FIG. 3 is a circuit diagram of a first exemplary embodiment of a differential amplifier circuit for an APD.

A first exemplary embodiment of an optical receiver 400 is shown in FIG. 3. The first embodiment includes an APD equivalent impedance 420, including a capacitor 422 having equivalent junction capacitance of the APD 450, a resistor 423 with equivalent series resistance of the APD 450 and an inductor 424 with equivalent inductance of the APD 450 interconnected to transimpedance amplifier 470 and the high voltage supply 410. In particular, the APD 450 is disposed between the high voltage supply 410 and a first input of the differential transimpedance amplifier 470, while the APD equivalent impedance 420 is connected between the high voltage supply 410 and a second input to the differential transimpedance amplifier 470 with outputs 460, 465.

Figure 4:
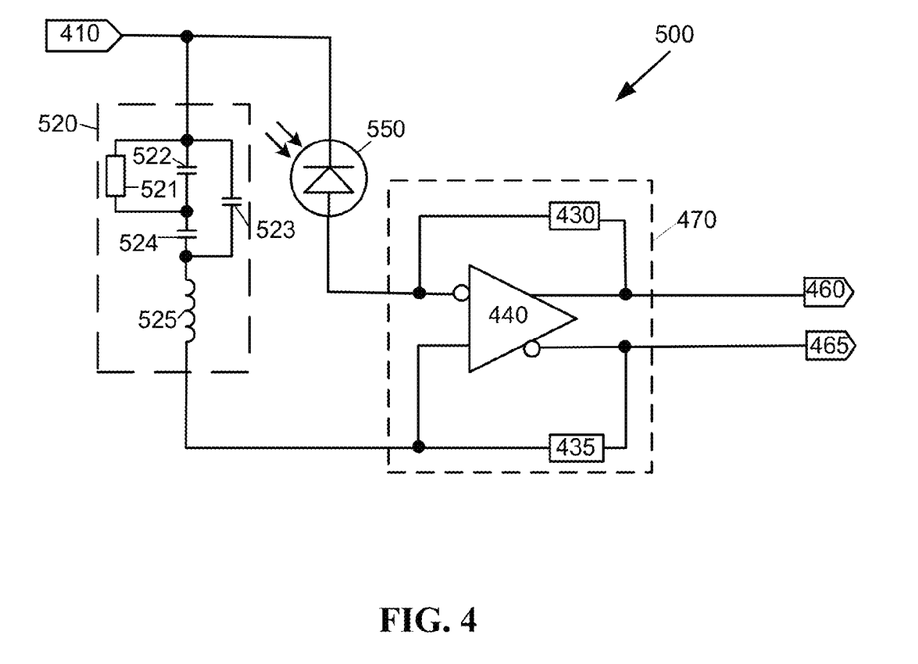
FIG. 4 is a circuit diagram of a second exemplary embodiment of a differential amplifier circuit for a SiPM.

A second exemplary embodiment 500 is shown in FIG. 4. For a SiPM 550, the voltage sensing element 520 may be built using the equivalent circuit as proposed by Corsi F. et al, "Modeling a silicon photomultiplier (SiPM) as a signal source for optimum front-end design," Nuclear Instruments and Methods in Physics Research A, 572 (2007), 416-418, where an equivalent SiPM quench resistor 521, a quench capacitor 522, a grid capacitance 523, a junction capacitance 524, and an inductor 525 representing the connection of the SiPM to the transimpedance amplifier 470 are used. The SiPM 550 is disposed between the high voltage supply 410 and the first input of the transimpedance amplifier 470, while the SiPM equivalent impedance 520 is connected between the high voltage supply 410 and the second input to the transimpedance amplifier 470.

Figure 5:
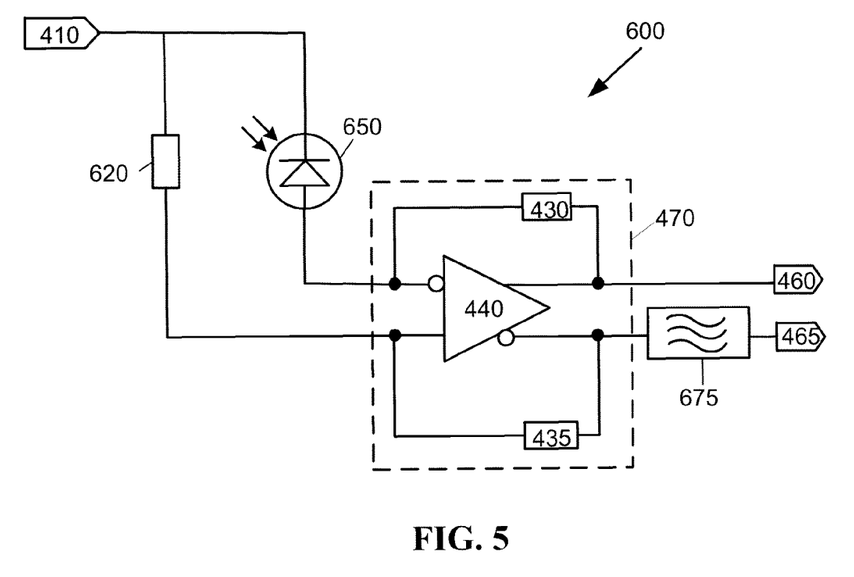
FIG. 5 is a circuit diagram of a third exemplary embodiment of a photodiode receiver circuit.

In a third embodiment of an optical receiver 600 shown in FIG. 5, the total output noise of the receiver 600 may be reduced by filtering the second output 465 of the differential transimpedance amplifier 470 with a filter 675 in order to respond to the frequency spectrum of the variation of the high voltage supply 410; for example noise often present on high voltage supply coming from a switching DC-DC converters. In the third embodiment, a photodetector 650 and a photodetector equivalent impedance 620 are used as inputs to the differential transimpedance amplifier 470. The photodetector impedance 620 may be implemented as, for example, the impedance load 420 from the first embodiment, the impedance load 520 from the second embodiment, or other impedance loads that substantially match the impedance of the photodetector 650. The circuit 600 maintains the noise associated with single ended transimpedance amplifier 470 outside of the bandpass of the filter 675 while getting rid of high voltage noise.

Another improvement over the prior art photodetector circuit of FIG. 1 can be useful when dealing with avalanche photodiodes. In range finding applications, strong optical pulses can impinge the avalanche photodiode 150. The photocurrent may be large enough to damage the transimpedance amplifier 140 and/or the photodetector 150. It is desirable to protect the receiver 100 from high optical power using a resistance in series with the APD 150. As the photocurrent through the photodetector 150 increases, the voltage across the photodetector 150 decreases due to the voltage building up across the resistor which reduce the gain (and the photocurrent) of an APD.

A resistance in series with the Avalanche photodiode 150 may reduce the bandwidth of the receiver 100 significantly, which limits its use for high frequency applications. In order to maintain the required bandwidth, a large decoupling capacitor (not shown) may be placed between the high voltage supply 110 and ground. This technique may limit the DC photocurrent but not a fast transient signal.

Figure 6:
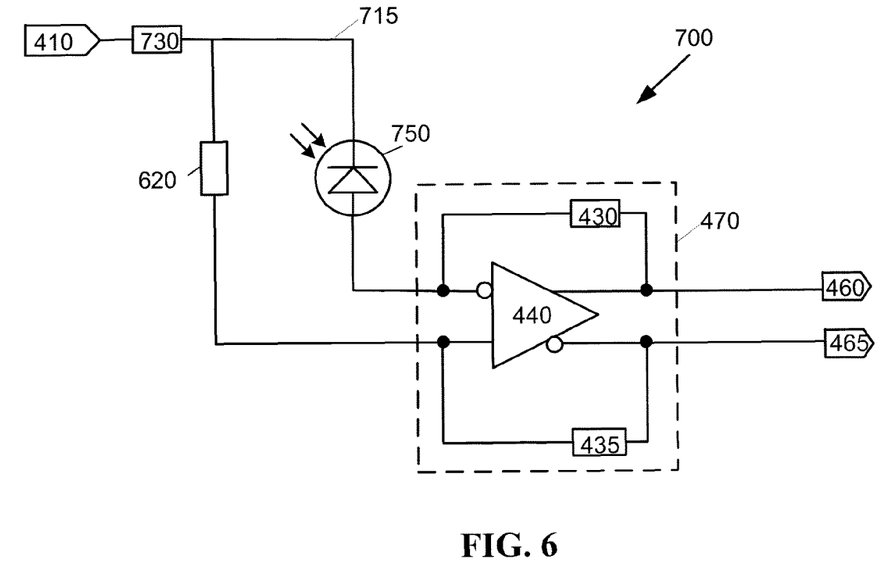
FIG. 6 is a circuit diagram of a fourth exemplary embodiment of a differential photodiode receiver circuit.

The differential configuration described above in the first, second and third embodiments can be used to eliminate this problem. A fourth exemplary embodiment is shown in FIG. 6. An impedance element 730, for example, a resistor or another impedance element, either passive or active, is placed between the high voltage source 410 and a high voltage supply 715 without impacting the frequency response of the receiver 700. This circuit 700 is equivalent to prior art shown in terms of frequency response. The impedance 730 may be used to drop the gain of the APD 750 in the event of a large power optical signal, and since there is no large capacitor on the high voltage supply 715, the circuit 700 responds to fast transient signal. The only capacitances present are the junction capacitance of the APD 750 and the equivalent capacitance of the high voltage supply variation sensing element 620.

The APD high voltage supply 715 returns to a pre-pulse value when optical power returns to zero. Again, the current induced in the high voltage sensing element 620 during the recharge (or the "recharge current") counterbalances the current induced in the APD equivalent impedance 620 due to the variation of the high voltage supply 410 leaving a clean signal at the output of the differential transimpedance amplifier 470.

If not taken into account, the recharge current may appear as an offset voltage at the output of the transimpedance amplifier 470 which may be difficult to handle in the case of a simple leading edge comparator to detect the presence of a pulse or may saturate the transimpedance amplifier 470.

Figure 7:
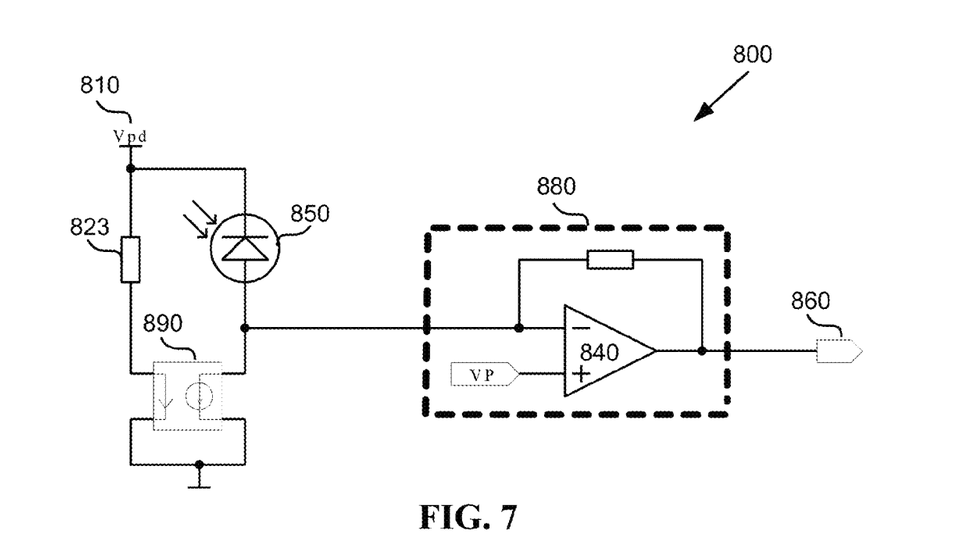
FIG. 7 is a circuit diagram of a fifth exemplary embodiment of a differential photodiode circuit with a current mirror.

A fifth exemplary embodiment, shown in FIG. 7, provides a way to eliminate high voltage supply variation induced current through a photodetector equivalent impedance 823 and provides an extended dynamic range optical receiver 800 by using a pseudo-differential receiver. This is particularly interesting to optical receivers using an avalanche photodiode 850 where the high voltage supply 810 can be used to control the gain of the APD 850; gain which impacts the signal-to-noise ratio (SNR) of the signal at the output of the optical receiver 800. As such, this circuit allows the user of the APD receiver 800 to actively adjust the APD high voltage supply 810 while the circuit is in operation with reduced impact on the detection capability of the receiver 800.

Elimination of the high voltage supply variation is achieved by sensing the current flowing through the photodetector 850 due to bias voltage variation with a voltage sensing element 823 converting the high voltage supply variation in a current of nearly equal amplitude as the current induced in the photodetector 850 by a high voltage supply 810 variation and a current mirror 890 connected to the high voltage supply variation sensing element 823 at the input of the transimpedance amplifier 880. The current mirrored at the input of the transimpedance amplifier 880 can be much larger than the dynamic range of the transimpedance amplifier 880 which extends the dynamic range of the optical receiver 800 regarding bias voltage variations. This circuit forms a pseudo differential transimpedance amplifier with regards to photodetector bias voltage supply variation.

As with the first embodiment, in the fifth embodiment an optical receiver circuit 800 for converting an optical signal to an electrical signal uses a photodetector 850 having its cathode connected to a high voltage supply 810 and its anode connected to the input of a transimpedance amplifier 880. High voltage supply variation induces an AC current flowing through the avalanche photodiode equivalent impedance 823 and is added to the photocurrent from the photodetector 850. The high voltage variation induced current is summed to the photocurrent and can add noise, create an offset to output voltage of the transimpedance amplifier, or impact the frequency response of the optical receiver 800 if the voltage variation is correlated to the photocurrent.

The voltage sensing element 823 is connected to the high voltage supply 810 and is used to convert the high voltage supply variation to a current nearly equal amplitude as the current induced in the photodetector 850. The current from the high voltage sensing element 823 is mirrored to the input of the transimpedance amplifier 880 in order to annihilate the induced current in the avalanche photodiode 850 from high voltage supply variation.

The photocurrent generated in a photodetector 850 is sent to the transimpedance amplifier 880 where the photocurrent signal is converted to a voltage for further processing, for example, at the output 860. The voltage sensing element 823, having its impedance equal the impedance of the photodetector 850 is used to sense the high voltage supply 810 variation. The current flowing through the voltage sensing device 823 is mirrored, using a current mirror 890, to the input of the of the transimpedance amplifier thus removing any current induced in the photodetector 850 by the high voltage supply 810 variation.

The readily available single input transimpedance amplifier 880 may have high bandwidth and low noise. The current mirror 890 may have high current handling capabilities and can respond quickly to high voltage variation due to the limited gain required to achieve this function. No feedback from the transimpedance amplifier 880 output is required thus improving recovery time in the event of a large high voltage supply variation. This also makes the receiver 800 less prone to oscillation. Input protection and variable transimpedance can be implemented by the circuit 800 for extended photocurrent dynamic range.

Figure 8:
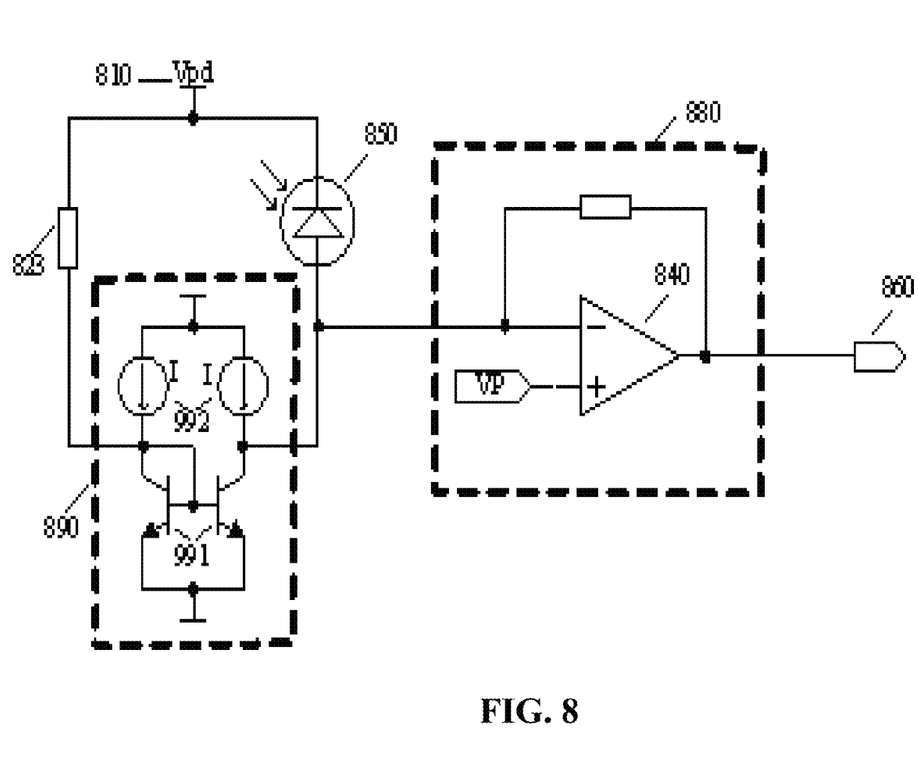
FIG. 8 is a circuit diagram of a sixth exemplary embodiment of a differential photodiode receiver circuit.

FIG. 8 shows an embodiment of the current mirror 890 made by two matched transistors 991 and two constant current sources 992 to bias the two matched transistors 991. While the current mirror 890 shown in FIG. 8 uses bipolar transistors 991, there is no objection to alternative embodiments using bipolar technology, for example, FET, MOSFET, HEMT or any other type of transistor technology.

The current mirror 890 configuration is notable for its simplicity. However, the designer is forced to compromise regarding bandwidth, input impedance, noise and current supply capabilities of the current mirror 890. Ideally, the input impedance of the current mirror 890 should be zero and noise generated by the current mirror 890 should be as low as possible.

Figure 9:
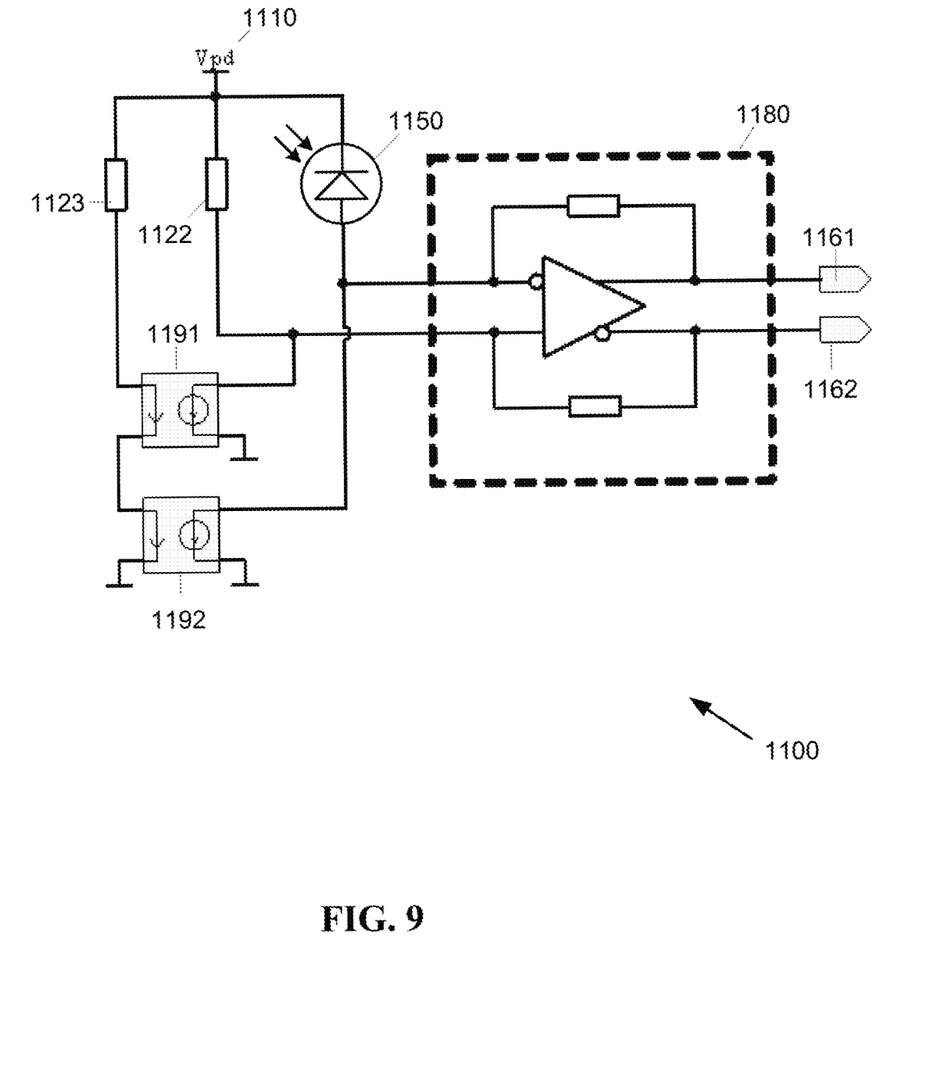
FIG. 9 is a circuit diagram of a seventh exemplary embodiment of a differential photodiode receiver circuit.

The seventh embodiment optical receiver circuit 1100 configuration, shown by FIG. 9, advantageously uses a differential transimpedance amplifier 1180 where a first input of the differential transimpedance amplifier 1180 is connected to a photodetector 1150 and a second input of the differential transimpedance amplifier 1180 is connected to a high voltage supply 1110 variation sensing element 1122 of equal impedance to the photodetector 1150.

A second high voltage sensing element 1123 is connected to 2 current mirrors 1191 and 1192 in series which are used to inject a current of equal amplitude at both inputs of the differential transimpedance amplifier 1180.

Since the input signal of the current mirrors 1191 and 1192 is the same, the current injected in both inputs of the differential transimpedance amplifier 1180, is seen as a common mode signal rejected by the Common Mode Rejection Ratio of the differential transimpedance amplifier 1180.

The two current mirrors 1191 and 1192 can be easily materialized by a single-input-double-output current mirror. This is particularly advantageous when noise generated by the current mirror can be injected simultaneously at both inputs of the differential transimpedance amplifier 1180 such that it is cancelled by the Common Mode Rejection Ratio of the differential transimpedance.

The differential transimpedance amplifier 1180 with the photodetector 1150 and first high voltage sensing element 1122 may respond to small high voltage supply variation and the second high voltage supply variation sensing element with the current mirrors 1191 and 1192 may handle large high voltage supply variation.

The high voltage sensing elements 1122 and 1123 are preferably of the same impedance as the photodetector 1150 in order to provide a current as close as possible to the induced current in the photodetector 1150. Ideally the high voltage sensing elements 1122, 1123 may be dummy photodetector, not receiving light signal, of the same type as the light sensing photodetector 1150. Alternatively, the high voltage sensing elements 1122, 1123 may be replaced by equivalent impedance as discussed for the first and second exemplary embodiments It should be noted that the current mirror 890 depicted in FIG. 7 and the current mirrors 1191, 1192 (FIG. 9) can be made by various ways familiar to persons having ordinary skill in the art. It is understood that these exemplary depictions of current mirrors are not intended to limit embodiments of the present invention from using other current mirror configurations familiar to persons having ordinary skill in the art.

In summary, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photoelectric receiver circuit for converting an optical signal to an electrical signal for high frequency applications, comprising:
   a differential transimpedance amplifier comprising a first input and a second input;
   a photodetector connected to the first input of the differential transimpedance amplifier;
   a high voltage source configured to provide a high voltage supply configured to provide a bias voltage to the photodetector;
   an impedance element connected between the high voltage source and the high voltage supply; and
   a voltage sensing element presenting a substantially similar impedance as the photodetector with one terminal connected to the high voltage supply and the second terminal connected to the second input of the differential transimpedance amplifier,
   wherein the impedance element is configured to drop the gain of the photodetector in the event of a large power optical signal impinging the photodetector.

2. The photoelectric receiver circuit of claim 1, wherein the voltage sensing element comprises a capacitor, a resistor, and an inductor.

3. The photoelectric receiver circuit of claim 2, wherein the capacitor, the resistor, and the inductor are connected in series.

4. The photoelectric receiver circuit of claim 1, wherein the voltage sensing element comprises an equivalent photodetector quench resistor, a quench capacitor, a grid capacitance and a junction capacitance.

5. The photoelectric receiver circuit of claim 4, wherein the equivalent photodetector quench resistor is connected in parallel with the quench capacitor, and the junction capacitance is connected in series with the parallel wired photodetector quench resistor and the quench capacitor.

6. The photoelectric receiver circuit of claim 4, wherein the junction capacitance is connected in parallel with a first subcomponent comprising the equivalent photodetector quench resistor, the quench capacitor and the grid capacitance.

7. The photoelectric receiver circuit of claim 4, further comprising an inductance connected in series with a second subcomponent comprising the equivalent photodetector quench resistor, the quench capacitor, the grid capacitance, and the junction capacitance.

8. The photoelectric receiver circuit of claim 1, further comprising a bandpass filter connected to at least one output of the differential transimpedance amplifier.

9. The photoelectric receiver circuit of claim 1, wherein the voltage sensing element comprises a dummy photodetector substantially similar to the photodetector.

10. A photoelectric receiver circuit for converting an optical signal to an electrical signal for high frequency applications, comprising:
    a single input transimpedance amplifier;
    a photodetector connected to the input of the single input transimpedance amplifier;

a high voltage supply source configured to supply a bias voltage to the photodetector;

a voltage sensing element presenting a substantially similar impedance as the photodetector connected between the high voltage supply and a current mirror input, wherein a current mirror output is connected to the photodetector and the input of the single input transimpedance amplifier.

11. The photoelectric receiver circuit of claim 10, further comprising an impedance element connected between the high voltage supply source and the photodetector, wherein the impedance element is configured to drop the gain of the photodetector in the event of a large power optical signal impinging the photodetector.

12. The photoelectric receiver circuit of claim 10, wherein the voltage sensing element comprises a dummy photodetector substantially similar to the photodetector.

13. The photoelectric receiver circuit of claim 10, wherein the voltage sensing element comprises a capacitor, a resistor, and an inductor.

14. The photoelectric receiver circuit of claim 13, wherein the capacitor, the resistor, and the inductor are connected in series.

15. The photoelectric receiver circuit of claim 10, wherein the voltage sensing element comprises an equivalent photodetector quench resistor, a quench capacitor, a grid capacitance and a junction capacitance.

16. The photoelectric receiver circuit of claim 15, wherein the equivalent photodetector quench resistor is connected in parallel with the quench capacitor, and the junction capacitance is connected in series with the parallel wired photodetector quench resistor and the quench capacitor.

17. The photoelectric receiver circuit of claim 15, wherein the junction capacitance is connected in parallel with a first subcomponent comprising the equivalent photodetector quench resistor, the quench capacitor and the grid capacitance.

18. The photoelectric receiver circuit of claim 15, further comprising an inductance connected in series with a second subcomponent comprising the equivalent photodetector quench resistor, the quench capacitor, the grid capacitance, and the junction capacitance.

19. A photoelectric receiver circuit for converting an optical signal to an electrical signal for high frequency applications, comprising:

a differential transimpedance amplifier;

a photodetector connected to a first input of the differential transimpedance amplifier;

a high voltage supply source configured to supply a bias voltage to the photodetector;

a first voltage sensing element presenting a substantially similar impedance as the photodetector connected between the high voltage supply and a second input of the differential transimpedance amplifier;

a second voltage sensing element presenting a substantially similar impedance as the photodetector connected between the high voltage supply and an input of a first current mirror; and a second current mirror connected between the first current mirror and the second input of the differential amplifier, wherein the first current mirror output is connected to the first input of the differential transimpedance amplifier.

20. The photoelectric receiver circuit of claim 19, further comprising a single current mirror comprising the first current mirror and second current mirror, wherein the single current mirror comprises one sensing input and two outputs.

21. The photoelectric receiver circuit of claim 19, wherein at least one of the first voltage sensing element and the second voltage sensing element comprises a dummy photodetector substantially similar to the photodetector.

22. The photoelectric receiver circuit of claim 19, wherein the voltage sensing element comprises a capacitor, a resistor, and an inductor.

23. The photoelectric receiver circuit of claim 22, wherein the capacitor, the resistor, and the inductor are connected in series.

24. The photoelectric receiver circuit of claim 19, wherein the voltage sensing element comprises an equivalent photodetector quench resistor, a quench capacitor, a grid capacitance and a junction capacitance.

25. The photoelectric receiver circuit of claim 19, further comprising a bandpass filter connected to at least one output of the current mirror.

26. The photoelectric receiver circuit of claim 19, further comprising an impedance element connected between the high voltage supply source and the photodetector.

* * * * *